(12) United States Patent
McIntyre et al.

(10) Patent No.: US 9,762,269 B2
(45) Date of Patent: *Sep. 12, 2017

(54) RF COMMUNICATIONS DEVICE WITH CONDUCTIVE TRACE AND RELATED SWITCHING CIRCUITS AND METHODS

(71) Applicant: HARRIS CORPORATION, Melbourne, FL (US)

(72) Inventors: John McIntyre, Rochester, NY (US); Kevin Dell, Fairport, NY (US); Christopher David Mackey, Spencerport, NY (US); John Paul Shoots, Palmyra, NY (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/346,819

(22) Filed: Nov. 9, 2016

(65) Prior Publication Data

US 2017/0104504 A1    Apr. 13, 2017

Related U.S. Application Data

(63) Continuation of application No. 14/877,248, filed on Oct. 7, 2015, now Pat. No. 9,525,443.

(51) Int. Cl.
*H04B 1/04*    (2006.01)
*H03K 17/74*    (2006.01)
(Continued)

(52) U.S. Cl.
CPC .......... *H04B 1/0483* (2013.01); *H03K 17/74* (2013.01); *H01L 23/13* (2013.01); *H01L 29/0688* (2013.01); *H01L 2924/1015* (2013.01)

(58) Field of Classification Search
CPC ..... H01L 23/13; H01L 29/06; H01L 29/0688; H01L 2924/1015
(Continued)

(56) References Cited

U.S. PATENT DOCUMENTS 4,891,522 A    1/1990    Coon et al.
4,905,071 A    2/1990    Chalifour et al.
(Continued)

FOREIGN PATENT DOCUMENTS

EP    0556941    9/1997

OTHER PUBLICATIONS

Godbout et al., "Advances in Plastic Surface Mount Silicon and GaAs Schottky Diodes for High Frequency Detectors and Mixers," Aeroflex/Metelics, Mar. 2010, pp. 36 and 60 see U.S. Appl. No. 14/877,248, filed Oct. 7, 2015.
(Continued)

*Primary Examiner* — Duc M Nguyen
(74) *Attorney, Agent, or Firm* — Allen, Dyer, Doppelt, + Gilchrist, P.A.

(57) ABSTRACT

An RF communications device may include a circuit board having a dielectric layer and conductive traces, one of the conductive traces defining a transmission line. The RF communications device may also include an RF transmitter carried by the circuit board and coupled to the transmission line, and RF switching circuits, each RF switching circuit including a substrate having a tapered proximal end coupled to the transmission line, and a distal end extending outwardly on the convex side of the transmission line. Each RF switching circuit may include a series diode, and a shunt diode coupled to the series diode, the series diode extending from the tapered proximal end and across an interior of the substrate.

13 Claims, 10 Drawing Sheets

(51) Int. Cl.
*H01L 29/06* (2006.01)
*H01L 23/13* (2006.01)

(58) Field of Classification Search
USPC .......................................... 455/120, 121, 129
See application file for complete search history.

(56) References Cited

U.S. PATENT DOCUMENTS

| | | |
|---|---|---|
| 5,350,957 A | 9/1994 | Cooper et al. |
| 5,524,283 A | 6/1996 | Miyakawa et al. |
| 5,973,376 A | 10/1999 | Rostoker et al. |
| 6,097,073 A | 8/2000 | Rostoker et al. |
| 6,312,980 B1 * | 11/2001 | Rostoker ............. G06F 17/5072 257/E23.151 |
| 6,351,628 B1 | 2/2002 | Leizerovich et al. |
| 6,407,434 B1 | 6/2002 | Rostoker et al. |
| 6,658,177 B1 | 12/2003 | Chertkow |
| 6,831,542 B2 * | 12/2004 | Groves ................ H03K 17/965 336/115 |
| 7,755,173 B2 | 7/2010 | Mondi et al. |
| 8,907,858 B2 | 12/2014 | Yang et al. |
| 8,937,575 B2 | 1/2015 | Ward et al. |
| 9,331,570 B2 | 5/2016 | McIntyre et al. |
| 2003/0102936 A1 | 6/2003 | Schaefer |
| 2004/0048634 A1 | 3/2004 | Satoh et al. |
| 2004/0164825 A1 * | 8/2004 | Volant ................... H03K 17/965 335/78 |
| 2004/0245638 A1 | 12/2004 | Nemtsev et al. |
| 2008/0030285 A1 * | 2/2008 | Gurov ....................... H01P 1/15 333/104 |
| 2008/0212552 A1 | 9/2008 | Fukamachi et al. |
| 2009/0001527 A1 | 1/2009 | Mondi et al. |
| 2010/0308429 A1 | 12/2010 | Ma et al. |
| 2011/0261605 A1 | 10/2011 | Kioussis et al. |
| 2012/0074428 A1 | 3/2012 | Arai et al. |
| 2013/0130630 A1 | 5/2013 | Crandall |
| 2014/0062822 A1 * | 3/2014 | Tseng .................... H01Q 21/26 343/798 |

OTHER PUBLICATIONS

Aeroflex Metelics, Application Note AN55131B, Design of Low Cost High Performance 20W and 50W Transmit and Receive Antenna Switches, Oct. 12, 2011, pp. 1-8 see U.S. Appl. No. 14/877,248, filed Oct. 7, 2015.

Aeroflex Metelics, MSWSSB-020-30 Pin Diode Shunt Switch Element, Jul. 15, 2014, pp. 1-4 see U.S. Appl. No. 14/877,248, filed Oct. 7, 2015.

Texas Instruments, "CC3200 SimpleLink Wi-Fi and IoT Solution with MCU-Antenna BoosterPack," User's Guide, Oct. 2014, pp. 1-17 See U.S. Appl. No. 14/877,248, filed Oct. 7, 2015.

* cited by examiner

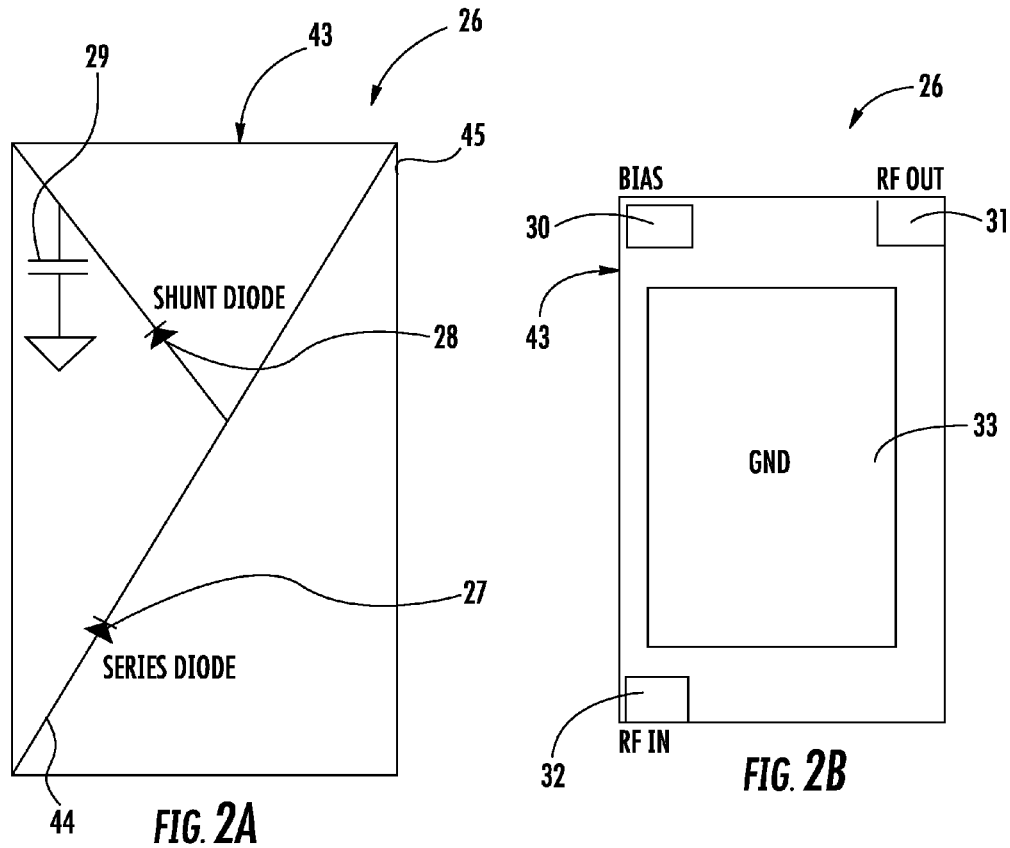
FIG. 2A
FIG. 2B
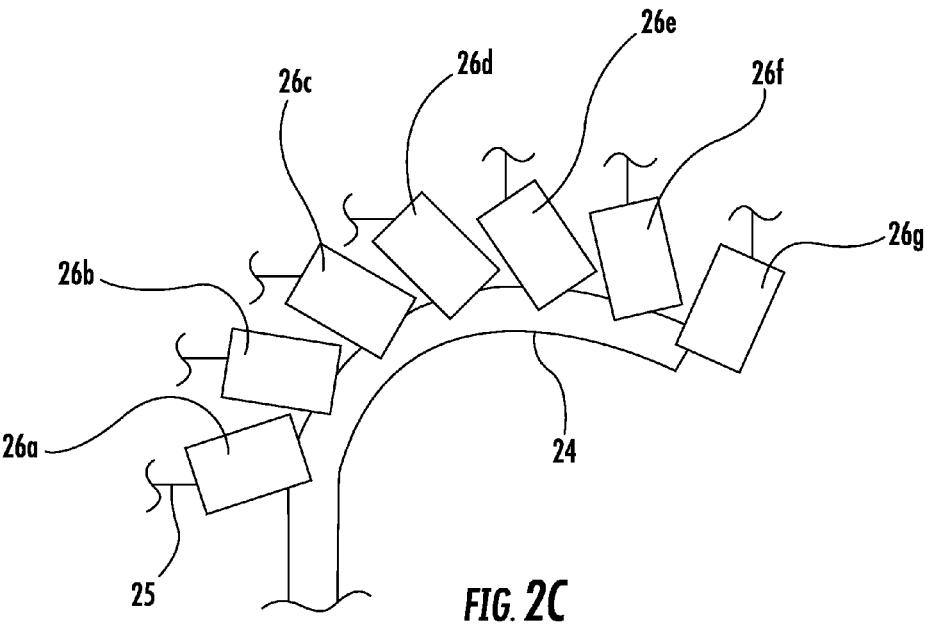
FIG. 2C

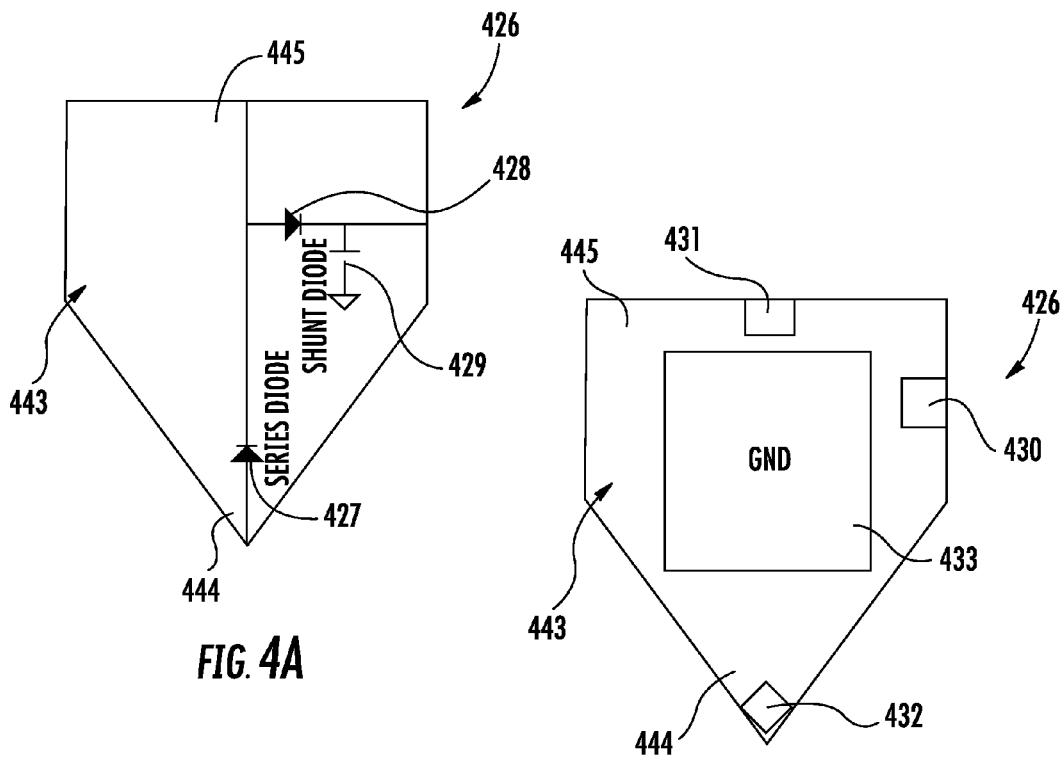
FIG. 4A
FIG. 4B
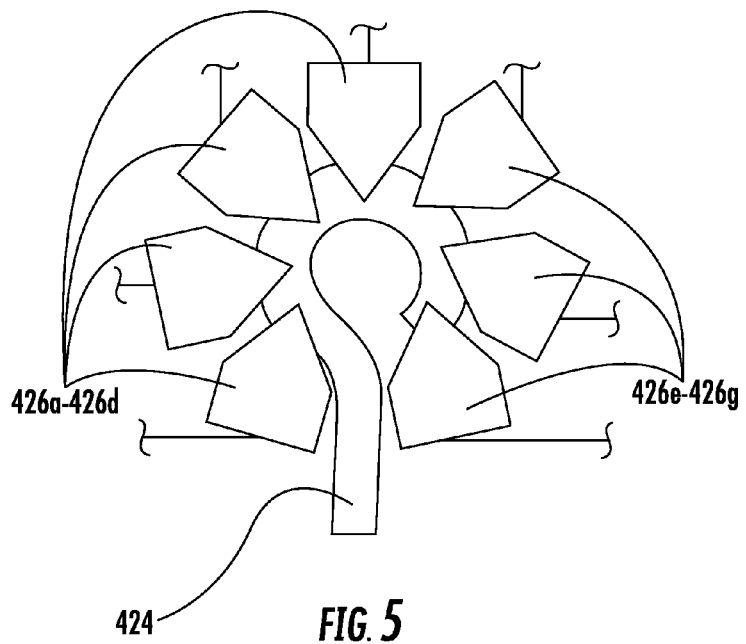
FIG. 5

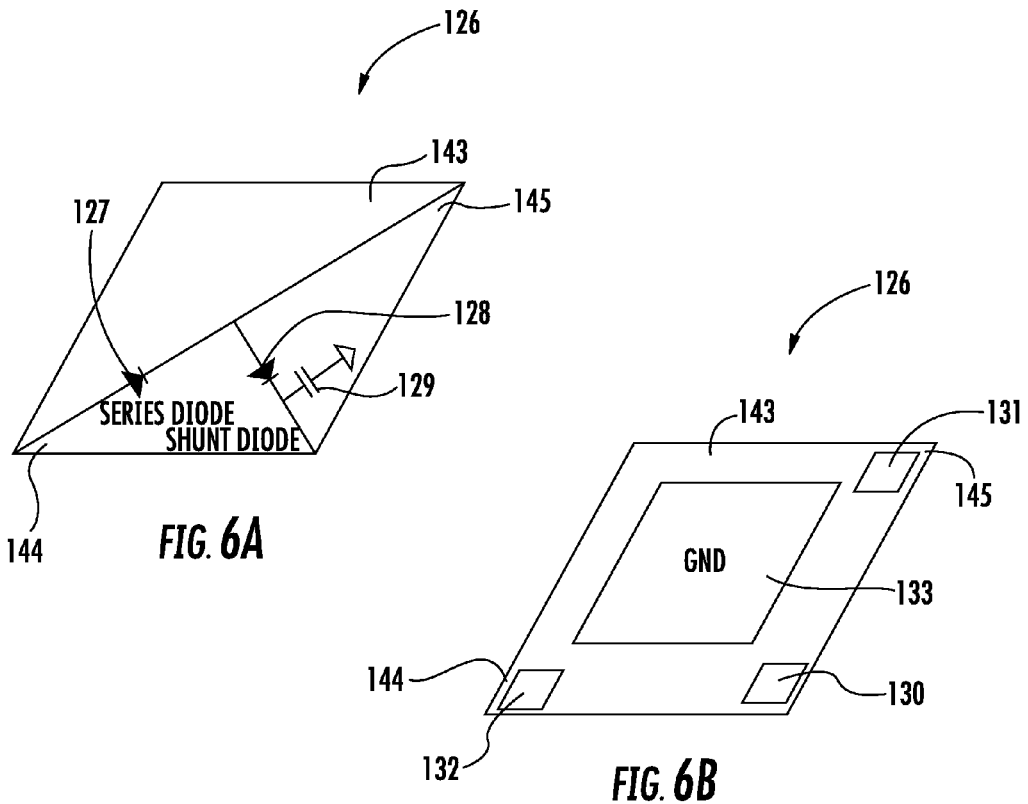
FIG. 6A
FIG. 6B
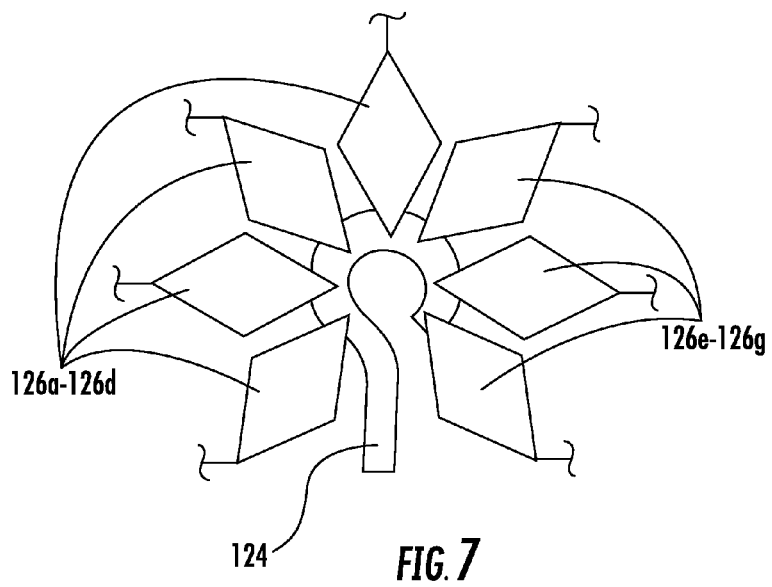
FIG. 7

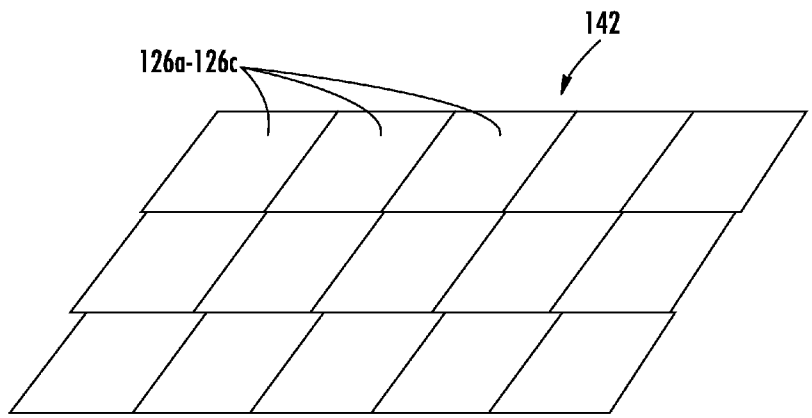
FIG. 8
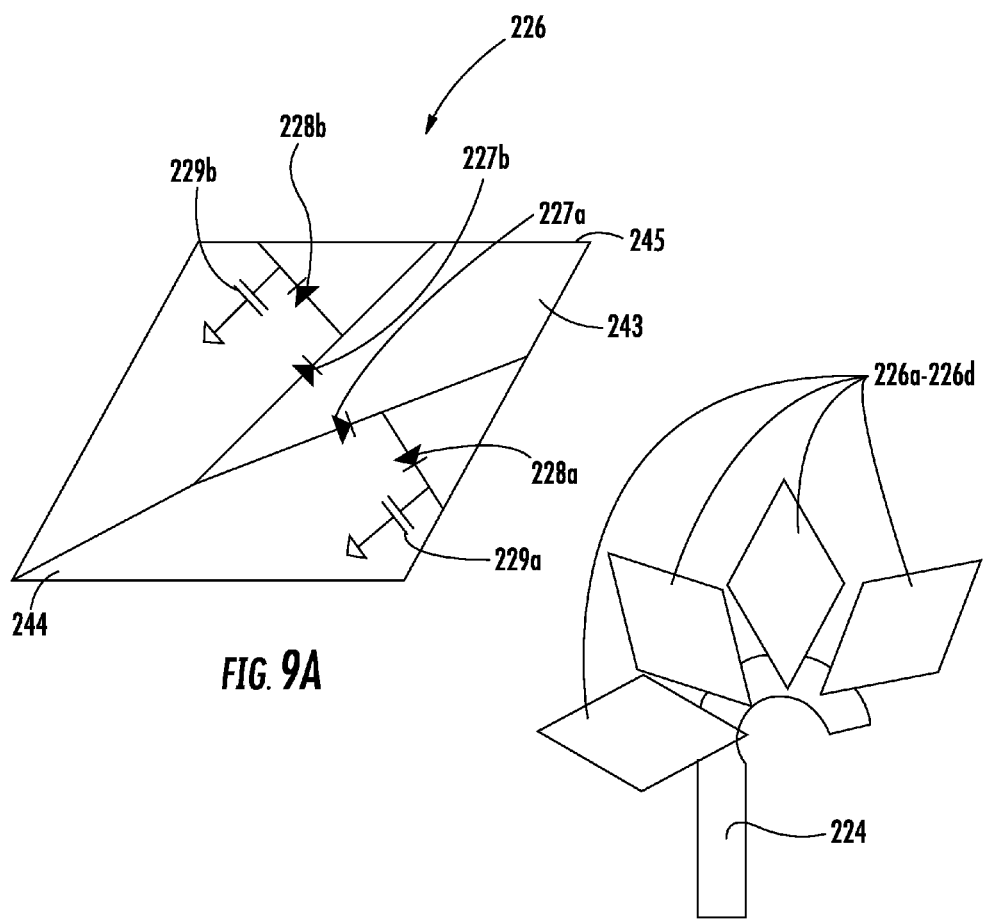
FIG. 9A
FIG. 9B

RF COMMUNICATIONS DEVICE WITH CONDUCTIVE TRACE AND RELATED SWITCHING CIRCUITS AND METHODS

TECHNICAL FIELD

The present disclosure relates to the field of communications devices, and, more particularly, to RF communications devices with RF switching circuits and related methods.

BACKGROUND

Wireless communications devices are an integral part of society and permeate daily life. The typical wireless communications device includes an antenna, and a transceiver coupled to the antenna. The transceiver and the antenna cooperate to transmit and receive communications signals. A typical radio frequency (RF) transceiver includes a power amplifier for amplifying low amplitude signals for transmission via the antenna.

In some communications devices, the RF transceiver operates at multiple frequency bands, i.e. a multi-band communications device. Accordingly, the multi-band communications device may include a switch between the antenna and the RF transceiver for routing the appropriate signal through frequency band specific circuitry, such as power amplifiers and filters. In certain high power applications, diode switches may be used for the switch. In one approach, the diode switches comprise PIN (i.e. a diode with a wide, undoped intrinsic semiconductor region between a p-type semiconductor and an n-type semiconductor region) diodes in a series-shunt configuration.

A series-shunt configuration of PIN diode switches is typically used to achieve a relatively high isolation, which may be important in high frequency applications, for example greater than 1 GHz. To achieve relatively high isolation in the high power application, for example, greater than 10 W, a relatively high reverse bias voltage is used. The series diode and shunt diode of a particular switched path must be forward and reversed biased complementarily to minimize insertion loss and maximize isolation. Packaged series-shunt PIN diode switches may provide increased thermal performance and higher isolation.

SUMMARY

Generally speaking, an RF communications device may include a circuit board comprising at least one dielectric layer and a plurality of conductive traces thereon. One of the plurality of conductive traces may define a transmission line. The RF communications device may also include an RF transmitter carried by the circuit board and coupled to the transmission line, and a plurality of RF switching circuits. Each RF switching circuit may comprise a substrate having a tapered proximal end coupled to the transmission line, and a distal end extending outwardly from the transmission line. Each RF switching circuit may include a series diode, and a shunt diode coupled to the series diode, the series diode extending from the tapered proximal end and across an interior of said substrate. Advantageously, the arrangement of the plurality of RF switching circuits may reduce loss in the transmission line.

In some embodiments, each RF switching circuit is one of triangle-shaped, or rhomboid-shaped. In another embodiment, the proximal ends of the plurality of RF switching circuits are triangle-shaped, and the distal ends of the plurality of RF switching circuits are rectangle-shaped.

Additionally, the RF communications device may further comprise an antenna coupled to the distal ends of the plurality of RF switching circuits. Each RF switching circuit may be discretely packaged.

The shunt diode may comprise a PIN shunt diode, and the series diode may comprise a PIN series diode. Also, the plurality of RF switching circuits may be coupled to the transmission line in order of increasing operational frequency.

Another aspect is directed to an RF switching circuit for a communications device. The RF switching circuit may include a rhomboid-shaped substrate, and RF switching circuitry carried by the rhomboid-shaped substrate and to be coupled between an RF transmitter in the communications device and a transmission line in the communications device. The rhomboid-shaped substrate may have a tapered proximal end to be coupled to the transmission line, and a distal end extending outwardly from the transmission line.

Yet another aspect is directed to an RF switching circuit for a communications device. The RF switching circuit may include a triangle-shaped substrate, and RF switching circuitry carried by the triangle-shaped substrate and to be coupled between an RF transmitter in the communications device and a transmission line in the communications device. The triangle-shaped substrate may have a tapered proximal end to be coupled to the transmission line, and a distal end extending outwardly from the transmission line.

Another aspect is directed to an RF switching circuit for a communications device. The RF switching circuit may include substrate, and RF switching circuitry carried by the substrate and to be coupled between an RF transmitter in the communications device and a transmission line in the communications device. The substrate may have a triangle-shaped proximal end to be coupled to the transmission line, and a rectangle-shaped distal end extending outwardly from the transmission line.

Another aspect is directed to a circuit device. The circuit device may include a rhomboid-shaped substrate, and circuitry carried by the rhomboid-shaped substrate and to be coupled between a first circuit and a second circuit. The rhomboid-shaped substrate may have a tapered proximal end to be coupled to the second circuit, and a distal end extending outwardly from the second circuit.

Another aspect is directed to a circuit device. The circuit device may include a substrate, and circuitry carried by the substrate and to be coupled between a first circuit and a second circuit. The substrate may have a triangle-shaped proximal end to be coupled to the second circuit, and a rectangle-shaped distal end extending outwardly from the second circuit.

Another aspect is directed to a method of making an RF communications device. The method may include forming a circuit board comprising at least one dielectric layer and a plurality of conductive traces thereon, one of the plurality of conductive traces defining a transmission line, and forming an RF transmitter on the circuit board and coupled to the transmission line. The method may further comprise forming a plurality of RF switching circuits, each RF switching circuit comprising a substrate having a tapered proximal end coupled to the transmission line, and a distal end extending outwardly from the transmission line. Each RF switching circuit may include a series diode, and a shunt diode coupled to the series diode, the series diode extending from the tapered proximal end and across an interior of the substrate.

BRIEF DESCRIPTION OF THE DRAWINGS

FIGS. 2A and 2B are respectively a schematic circuit diagram and a schematic packaging diagram of an embodiment of the RF switching circuit from the RF communications device of FIG. 1.

FIG. 2C is a schematic diagram of an embodiment of RF switching circuits coupled to a launch trace from the RF communications device of FIG. 1.

FIGS. 4A and 4B are respectively a schematic diagram and a schematic packaging diagram of another embodiment of the RF switching circuit, according to the present disclosure.

FIG. 5 is a schematic diagram of several RF switching circuits from FIGS. 4A-4B coupled to a launch trace.

FIGS. 6A and 6B are respectively a schematic diagram and a schematic packaging diagram of yet another embodiment of the RF switching circuit, according to the present disclosure.

FIG. 7 is a schematic diagram of several RF switching circuits from FIGS. 6A-6B coupled to a launch trace.

FIG. 8 is a schematic diagram of the RF switching circuits of FIGS. 6A-6B during manufacture.

FIG. 9A is a schematic diagram of another embodiment of the RF switching circuit, according to the present disclosure.

FIG. 9B is a schematic diagram of several RF switching circuits from FIG. 9A coupled to a launch trace.

DETAILED DESCRIPTION

Figure 1:
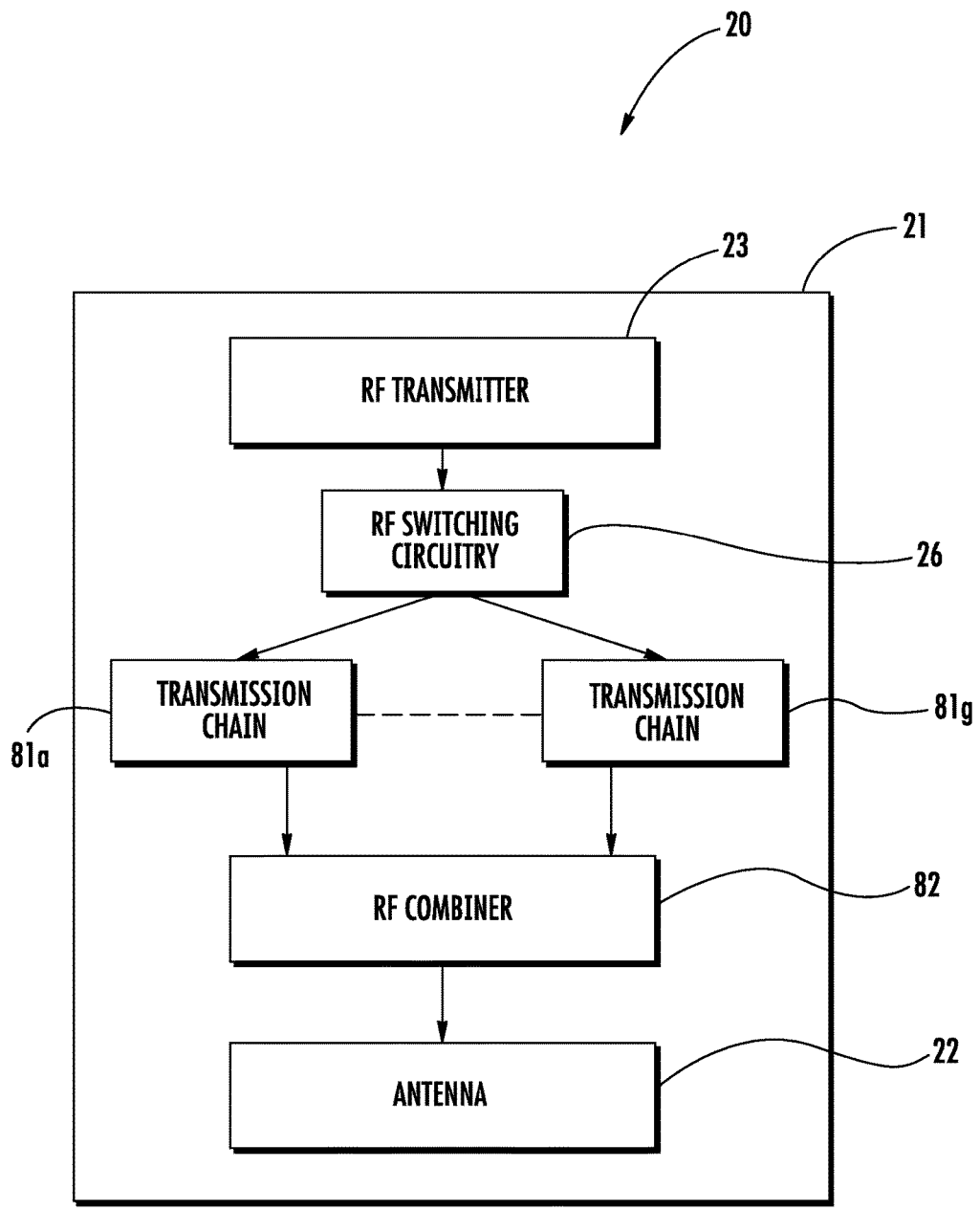
FIG. 1 is a schematic diagram of an RF communications device, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring initially to FIGS. 1-2C, an RF communications device 20 according to the present disclosure is now described. The RF communications device 20 illustratively includes a circuit board 21 comprising one or more dielectric layers and a plurality of conductive traces 24-25 on the dielectric layer. In the illustrated embodiment, one of the plurality of conductive traces 24-25 has a curved shape defining a transmission line (i.e. a launch, launch pad, or a curved launch trace) 24 with a convex side and a concave side.

The RF communications device 20 illustratively includes an RF transmitter (e.g. an RF transceiver) 23 carried by the circuit board 21 and coupled to the transmission line 24, and a plurality of RF switching circuits 26a-26g. Each RF switching circuit 26a-26g illustratively includes a tapered proximal end 44 coupled to the transmission line 24, and a distal end 45 extending outwardly on the convex side of the transmission line. Each RF switching circuit 26-26g may be discretely packaged.

In the illustrated embodiment, each RF switching circuit 26a-26g is rectangle-shaped. In other embodiments, the plurality of RF switching circuits 26a-26g may each be triangle-shaped (FIGS. 10A-12) or rhomboid-shaped (FIGS. 6A-9B). It should be appreciated that even other shapes can be used. Additionally, the RF communications device 20 illustratively includes an antenna 22 coupled to the distal ends 45 of the plurality of RF switching circuits 26a-26g. In some embodiments, such as the illustrated embodiment, the antenna 22 is carried by the circuit board 21, but in other embodiments, the antenna is carried off-chip.

The RF communications device 20 illustratively includes a plurality of transmission chains (e.g. band pass filters, power amplifiers, etc.) 81a-81g carried by the circuit board 21 and coupled respectively to the RF switching circuits 26a-26g. Also, the RF communications device 20 illustratively includes an RF combiner 82 carried by the circuit board 21 and coupled between the antenna 22 and the plurality of transmission chains 81a-81g.

As best seen in FIG. 2A, each RF switching circuit 26a-26g illustratively includes a substrate 43, a series diode 27 carried by the substrate, a shunt diode 28 carried by the substrate and coupled to the series diode, and a capacitor 29 carried by the substrate and coupled to the shunt diode. The series diode 27 extends (i.e. the series diode and the conductive traces coupling the cathode and anode of the series didoe) from the tapered proximal end 44 and in an opposite direction (i.e. towards the opposing corner and diagonally across the rectangle-shaped RF substrate 43. In particular, the series diode 27 extends along a line that substantially bisects (i.e. leaving 40-50% on each side) an angle defined by the tapered proximal end 44. In other words, the series diode 27 extends across an interior of the substrate 43. In some embodiments, the shunt diode 28 may comprise a PIN shunt diode, and the series diode 27 may comprise a PIN series diode, defining RF switching circuitry 27-29. Advantageously, the output line from a cathode of the series diode 27 extends diagonally across the substrate 43, extending between diagonal corners of the substrate. This diagonal arrangement permits the tapered proximal ends 44 of the plurality of RF switching circuits 26-26g to be coupled to the transmission line 24.

Figure 15:
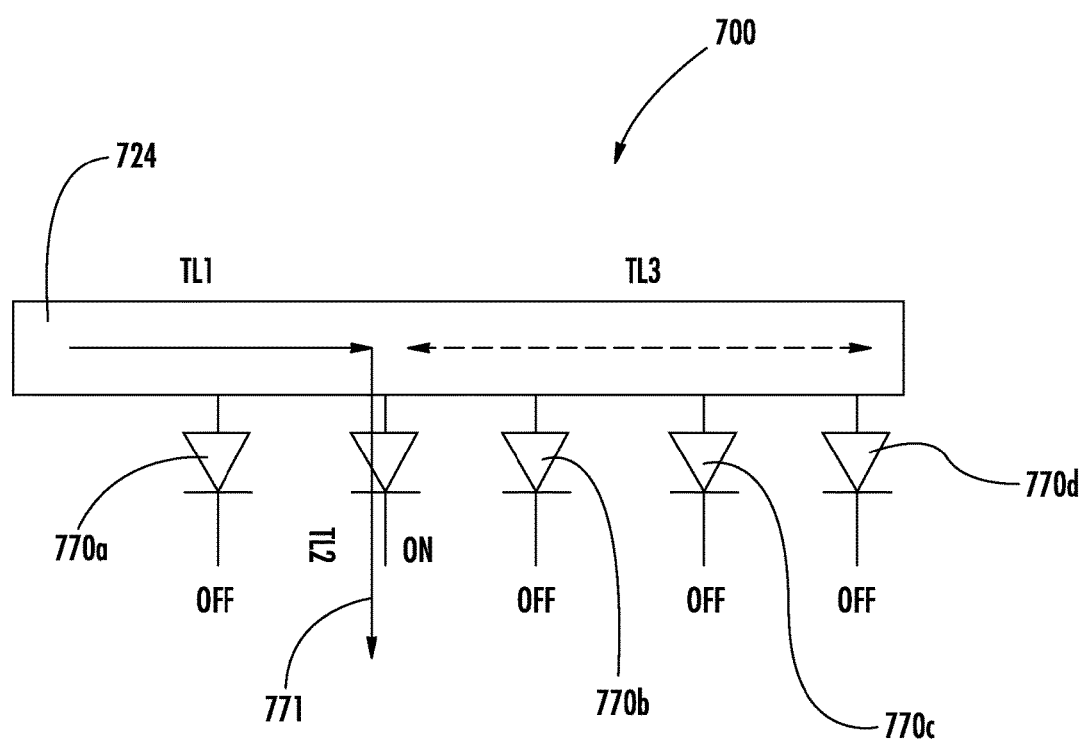
FIG. 15 is a modeling diagram of several RF switching circuits coupled to the launch trace, according to the present disclosure.

Also, with additional reference to diagram 700 of FIG. 15, in some embodiments, the plurality of RF switching circuits 26a-26g may be coupled to the transmission line 24, 724 in order of increasing operational frequency. In other words, the diodes are arranged in order (or roughly in order) from lowest frequency to highest frequency, i.e. 770a, 771, 770b, 770c, & 770d (if they represent switches between paths that cover different frequency bands such as a bank of filters). Helpfully, this may ensure that the highest frequency band will be at the distal end of the transmission line 24, 724 and will have the shortest open circuit stub, which allows for broadest band operation. The longest stub likely does not represent a problem at the lowest frequency band. In diagram 700, the second lowest frequency diode 771 is on, transmitting through portion TL1 and leaving an open circuit portion/stub TL3.

It should be appreciated that the transmission line 24, 724 is modeled as an infinite chain of series inductances and shunt capacitances. The reversed biased shunt diodes 770a-770d (i.e. off state) are modeled by a shunt capacitance, which is undesired. In the present disclosure, these shunt capacitances are advantageously absorbed along the transmission line 24, 724. Also, the transmission line 24, 724 width can be selected to maintain the desired impedance.

The capacitor 29 does not need to have a total needed capacitance, but only needs to have enough capacitance to provide high-frequency isolation where package parasitic effects would prohibit good performance. The rest of the capacitance needed for low-frequency isolation is accomplished with an off-chip capacitor. Approximately 10 pF on-chip (capacitor 29) and 100 pF to 1000 pF off-chip would be sufficient depending on frequencies of operation. Helpfully, the capacitor 29 is part of an integrated package and improves high frequency performance while allowing for proper selection of an external low frequency capacitor. Although not shown, the low frequency capacitor would be coupled to a node between the shunt diode 28 and the capacitor 29. Also, by integrating the series and shunt diodes 27-28 into a common, heat-sunk package, the RF switching circuit 26a-26g has improved isolation and power handling, as well as reduced size and complexity.

It should be appreciated that the RF switching circuitry 27-29 embodiment illustrated herein is exemplary. Other known PIN diode switch configurations may be used.

As best seen in FIG. 2B, each RF switching circuit 26a-26g illustratively includes an RF input node 32 coupled to an anode of the series diode 27, a bias node 30 coupled to a node between the capacitor 29 and the shunt diode 28. Also, each RF switching circuit 26a-26g illustratively includes an RF output node 31 coupled between the series diode 27 and the shunt diode 28, and a ground plane 33. It should be appreciated that the nodes 30-32 are illustratively rectangle-shaped, but could also be oval-shaped or circle-shaped.

Another aspect is directed to a method of making an RF communications device 20. The method includes forming a circuit board 21 comprising one or more dielectric layer and a plurality of conductive traces 24-25 thereon. One of the plurality of conductive traces 24-25 has a curved shape defining a transmission line 24 with a convex side and a concave side. The method includes forming an RF transmitter 23 on the circuit board 21 and coupled to the transmission line 24. The method further comprises forming a plurality of RF switching circuits 26a-26g, each RF switching circuit having a tapered proximal end 44 coupled to the transmission line 24, and a distal end 45 extending outwardly on the convex side of the transmission line.

Figure 3:
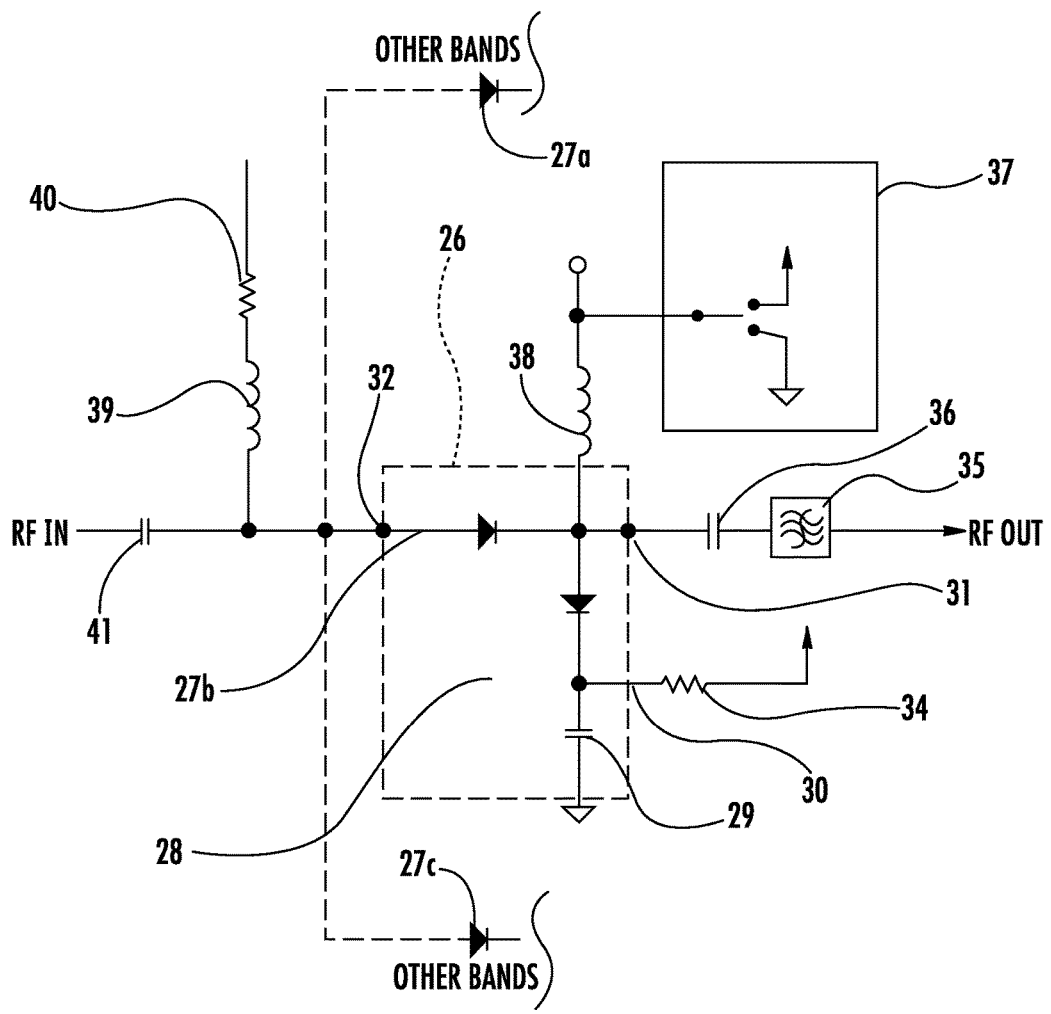
FIG. 3 is a detailed schematic diagram of another embodiment of the RF switching circuit, according to the present disclosure.

Referring now additionally to FIG. 3, an example embodiment of the RF communications device 20 is now described. The RF communications device 20 illustratively includes a second capacitor 36 coupled to the output node 31 of the RF switching circuit 26, and a band pass filter 35 coupled between the second capacitor and an RF out (i.e. the antenna 22). The RF communications device 20 illustratively includes a first inductor 38 coupled to the output node 31 of the RF switching circuit 26, and a high voltage driver 37 coupled to the first inductor. The RF communications device 20 illustratively includes a third capacitor 41 coupled to an RF input node (i.e. an output of the RF transmitter 23), a second inductor 39 coupled to the third capacitor, and a first resistor 40 coupled to the first inductor. Also, the RF communications device 20 illustratively includes a second resistor 34 coupled to the bias node 30 of the RF switching circuit 26. As will be appreciated, the output from the output of the RF transmitter 23 branches out into three output branches, each for a respective transmission frequency band.

In typical approaches to multi-band RF devices, there is a desire to selectively switch high power RF signals through multiple filter banks. A typical approach to this technical desire was to use PIN diode switches in series-shunt configuration to control routing of the high power RF signals. When designing the PIN diode switches, there are design trade-offs to be made in terms of three performance parameters: insertion loss (affects overall system power consumption); isolation (affects cosite, harmonics and spurious performance); and power handling capability (affects reliability). In some existing approaches, the PIN diode switches are either discrete approaches or packaged (multi-throw) approaches.

With discrete approaches, although quite flexibly configured and reconfigured, these approaches may have long launch paths (high insertion loss), and series diodes are poorly heat sunk and have high operating temperatures. Also, these discrete approaches suffer from package parasitic and length between series and shunt diodes, which reduce isolation performance, and suffer from high part counts, which may be difficult to layout and launch. Indeed, discrete approaches may suffer from poor performance at operational frequencies greater than 1 GHz and operational power modes greater than 5 W.

With packaged multi-throw approaches, the diode switches are thermally strong, have improved isolation, and have small launches. Nevertheless, these packaged approaches may suffer from the following issues: since each packaged diode switch device is quite inflexible, users typically need to source several different types of packaged multi-throw devices, which increases cost and lead times for design, and packaged diode switch devices are more expensive than discrete devices. Also, as customers change operational frequency bands, the inflexibility of packaged approaches may require substantial redesigns.

Advantageously, the plurality of RF switching circuits 26a-26g of the RF communications device 20 provides integrated series-shunt PIN diode switches with improved isolation, improved and rugged thermal performance, and fewer parts. Also, the plurality of RF switching circuits 26a-26g consumes less board space than in typical discrete approaches. Also, using the RF switching circuits 26a-26g as a switch building block, more complex switches can readily be assembled. For example, you can build an N-throw (SPnT) switch, or even (mPnT) switch. Indeed, the RF switching circuits 26a-26g are tesselated to enhance package density.

The compact shapes and corner pads of the plurality of RF switching circuits 26a-26g may allow for very tight optimal launches of high frequency operation. This is accomplished by shortening the length and associated loss of the transmission line 24. The reason minimizing the length of the transmission line 24 for all of the RF switching circuits 26a-26g is important is because the length of transmission line past the ON diode is an open-circuited stub. At some high frequency, this open circuit stub will look like a short circuit, and as you approach that frequency, the insertion loss of the switch will be degraded.

The disclosed RF switching circuit 26a-26g may allow for easy reconfiguration, but also with improved isolation. In essence, the RF switching circuit 26a-26g may afford the benefits of both the discrete approaches and the packaged approaches without the respective negatives.

Referring now additionally to FIGS. 4A-5, another embodiment of the RF communications device 420 is now described. In this embodiment of the RF communications device 420, those elements already discussed above with respect to FIGS. 1-3 are incremented by 400 and most require no further discussion herein. This embodiment differs from the previous embodiment in that this RF communications device 420 illustratively includes an RF switching circuit 426a-426g comprising a substrate 443, and RF switching circuitry 427-429 carried by the substrate and to be coupled between an RF transmitter 423 in the communications device 420 and a transmission line 424 in the communications device. The transmission line 424 has a convex side and a concave side. The substrate 443 has a triangle-shaped proximal end 444 to be coupled to the transmission line 424, and a rectangle-shaped distal end 445 extending outwardly on the convex side of the transmission line 424. In other words, the substrate 443 is "home plate-shaped". In other words, the substrate 443 is a five-sided polygon, i.e. a pentagon. The RF switching circuitry 427-429 extends from a vertex of the triangle-shaped proximal end 444 to a midpoint of a side of the rectangle-shaped distal end 445.

Referring now additionally to FIGS. 6A-8, another embodiment of the RF communications device 120 is now described. In this embodiment of the RF communications device 120, those elements already discussed above with respect to FIGS. 1-3 are incremented by 100 and most require no further discussion herein. This embodiment differs from the previous embodiment in that this RF communications device 120 illustratively includes an RF switching circuit 126a-126g comprising a rhomboid-shaped (i.e. parallelogram-shaped or diamond-shaped) substrate 143, and RF switching circuitry 127-129 carried by the rhomboid-shaped substrate and to be coupled between an RF transmitter 123 in the communications device and a transmission line 124 in the communications device. The transmission line 124 has a convex side and a concave side. The rhomboid-shaped substrate 143 illustratively includes a tapered (i.e. triangle-shaped) proximal end 144 to be coupled to the transmission line 124, and a distal end (i.e. triangle-shaped) 145 extending outwardly on the convex side of the transmission line. The RF switching circuitry 127-129 extends from a vertex of the triangle-shaped proximal end 144 to an opposing vertex the triangle-shaped distal end 145.

In FIG. 8, during manufacturing of the RF switching circuits 126a-126g, the rhomboid-shaped substrate 143 may be readily formed in bulk via a multi-step dicing process from a wafer 142. Advantageously, the multi-step dicing process may use only two dicing directions.

Referring now additionally to FIGS. 9A-9B, another embodiment of the RF communications device 220 is now described. In this embodiment of the RF communications device 220, those elements already discussed above with respect to FIGS. 1-3 are incremented by 200 and most require no further discussion herein. This embodiment differs from the previous embodiment in that this RF communications device 220 illustratively has each RF switching circuit 226a-226g comprising a single pole-double throw switch (SP2T). Each RF switching circuit 226a-226g comprises first and second series diodes 227a-227b, first and second shunt diodes 228a-228b coupled respectively to the first and second series diodes, and first and second capacitors 229a-229b coupled respectively to the first and second shunt diodes. In this embodiment, the transmission line 224 is C-shaped (i.e. a partial hairpin shape).

Although the other embodiments are illustrated with single pole-single throw (SPST) arrangements, the SP2T switch can be employed in any of the other embodiments/shapes disclosed herein. With SPSTs and SP2Ts, any switch configuration could be made with a very small size and compact launch. While extending these shapes past SP2T would be possible, combining SPSTs and SP2Ts makes it unnecessary. In some embodiments, only SP2Ts could be used as well. If the desired number of switch paths is odd, one port of an SP2T could be left unused.

Referring now additionally to FIGS. 10A-12, another embodiment of the RF communications device 320 is now described. In this embodiment of the RF communications device 320, those elements already discussed above with respect to FIGS. 1-3 are incremented by 300 and most require no further discussion herein. This embodiment differs from the previous embodiment in that this RF communications device 320 illustratively includes an RF switching circuit 326a-326g comprising a triangle-shaped substrate 343, and RF switching circuitry 327-329 carried by the triangle-shaped substrate and to be coupled between an RF transmitter 323 in the communications device and a transmission line 324 in the communications device. The transmission line 324 has a convex side and a concave side.

The triangle-shaped substrate 343 illustratively includes a tapered proximal end 344 to be coupled to the transmission line 324, and a distal end 345 extending outwardly on the convex side of the transmission line. The RF switching circuitry 327-329 extends between vertexes of the triangle-shaped substrate 343. In this embodiment, the transmission line 324 is candy-cane shaped or partial loop-shaped.

Figure 12:
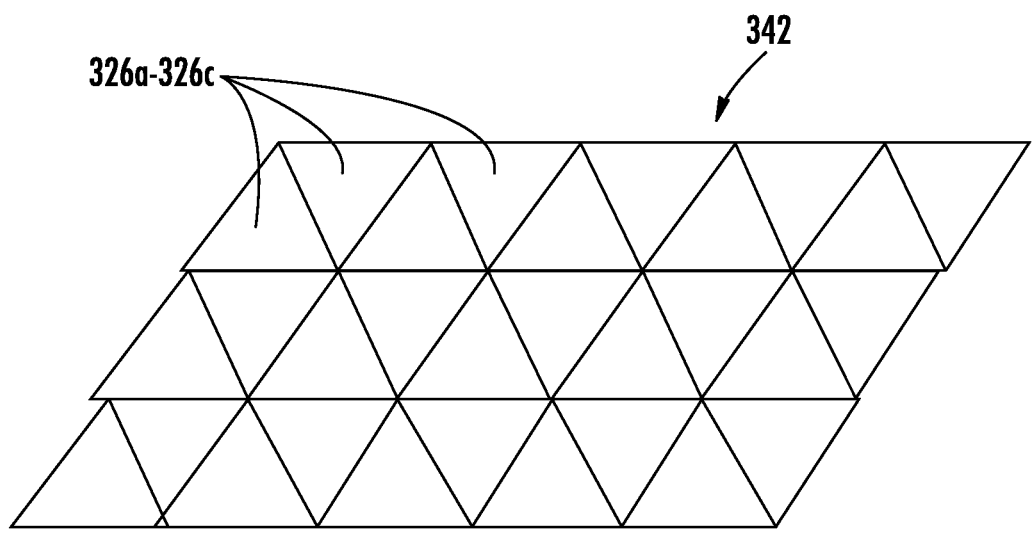
FIG. 12 is a schematic diagram of the RF switching circuits of FIGS. 10A-10B during manufacture.

In FIG. 12, during manufacturing of the RF switching circuits 326a-326g, the triangle-shaped substrate 343 may be readily formed in bulk via a multi-step dicing process from a wafer 342. Advantageously, the multi-step dicing process may use only three dicing directions.

Figure 10A:
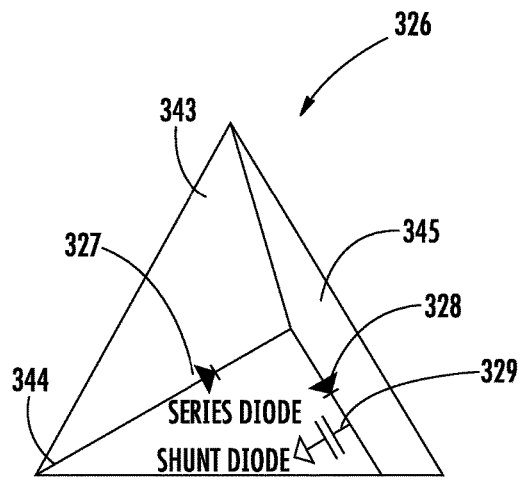
FIGS. 10A and 10B are respectively a schematic diagram and a schematic packaging diagram of another embodiment of the RF switching circuit, according to the present disclosure.
Figure 10B:
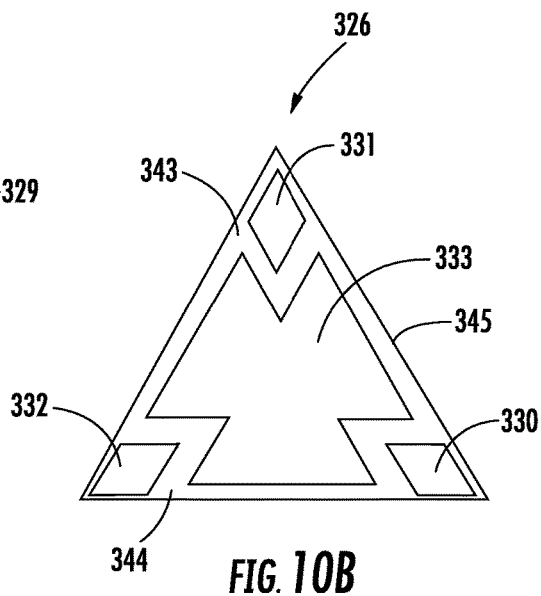
Figure 11:
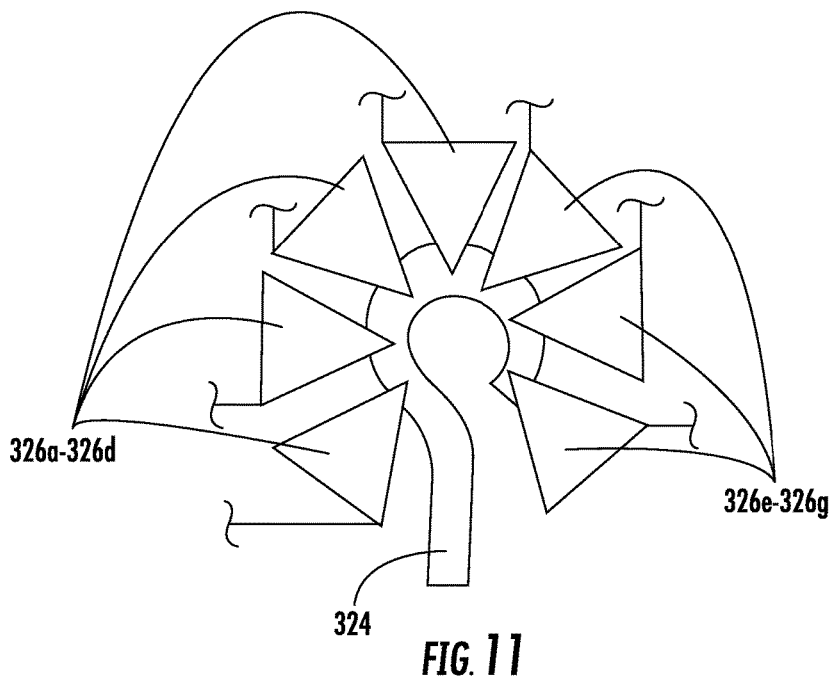
FIG. 11 is a schematic diagram of several RF switching circuits from FIGS. 10A-10B coupled to a launch trace.
Figure 13:
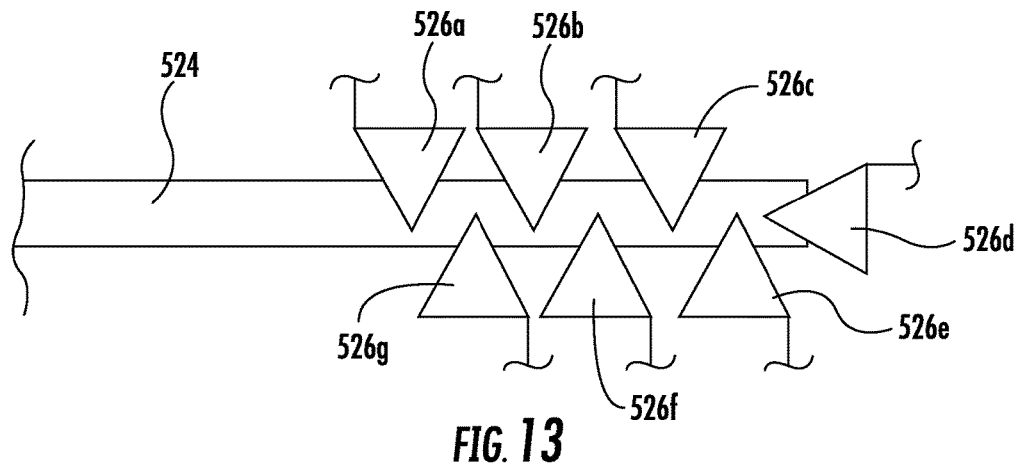
FIG. 13 is a schematic diagram of several RF switching circuits from FIGS. 10A-10B coupled to another embodiment of the launch trace.

Referring now additionally to FIG. 13, another embodiment of the transmission line 524 and RF switching circuits 526a-526g is now described. In this embodiment of the transmission line 524 and RF switching circuits 526a-526g, those elements already discussed above with respect to FIGS. 1-3 are incremented by 500 and most require no further discussion herein. This embodiment differs from the previous embodiment in that this transmission line 524 is straight and the RF switching circuits 526a-526g are triangle-shaped (FIGS. 10A-10B).

Figure 14:
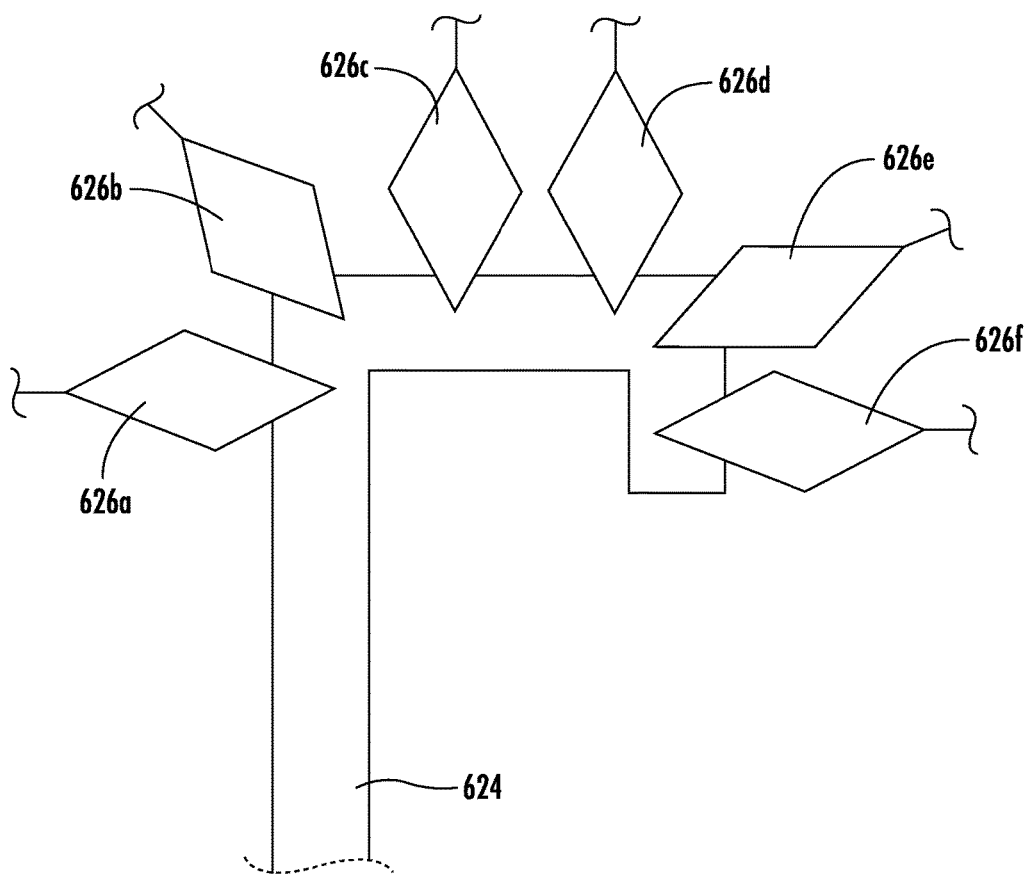
FIG. 14 is a schematic diagram of several RF switching circuits from FIGS. 9A-9B coupled to another embodiment of the launch trace.

Referring now additionally to FIG. 14, another embodiment of the transmission line 624 and RF switching circuits 626a-626f is now described. In this embodiment of the transmission line 624 and RF switching circuits 626a-626f, those elements already discussed above with respect to FIGS. 1-3 are incremented by 500 and most require no further discussion herein. This embodiment differs from the previous embodiment in that this transmission line 624 is L-shaped (i.e. intersecting straight lines at near/substantial right angles, range 85°-95°) and the RF switching circuits 626a-626g are diamond-shaped (FIGS. 6A-6B).

It should be appreciated that the above substrate shapes for RF switching circuits 26a-26g, 426a-426g, 126a-126g, 226a-226d, 326a-326g, 526a-526g, 626a-626f can be applied to other non-RF switching circuit types. For example, these other circuit types include circuit devices with generic circuitry, bias tees, feed chokes, detectors, Electrostatic discharge (ESD) protection, low temperature co-fired ceramic (LTCC) filters, power dividers, resistive taps, and varactor diodes.

Other features relating to RF communications devices are disclosed in co-pending application titled "SWITCHING CIRCUIT INCLUDING DC-DC CONVERTER COOPERATING WITH A HIGH VOLTAGE SUPPLY AND RELATED METHODS", U.S. patent application Ser. No. 14/451,957, which is incorporated herein by reference in its entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A radio frequency (RF) communications device comprising:
   a circuit board comprising at least one dielectric layer and a plurality of conductive traces thereon, one of said plurality of conductive traces defining a transmission line;
   an RF transmitter carried by said circuit board and coupled to said transmission line; and
   a plurality of triangle-shaped RF switching circuits, each triangle-shaped RF switching circuit comprising a substrate having a tapered proximal end coupled to said transmission line, and a distal end extending outwardly from said transmission line;
   each triangle-shaped RF switching circuit comprising a series diode, and a shunt diode coupled to said series diode, said series diode extending from the tapered proximal end and across an interior of said substrate.

2. The RF communications device of claim 1 further comprising an antenna coupled to the distal ends of said plurality of triangle-shaped RF switching circuits.

3. The RF communications device of claim 1 wherein each triangle-shaped RF switching circuit is discretely packaged.

4. The RF communications device of claim 1 wherein said shunt diode comprises a PIN shunt diode; and wherein said series diode comprises a PIN series diode.

5. The RF communications device of claim 1 wherein said plurality of triangle-shaped RF switching circuits are coupled to the transmission line in order of increasing operational frequency.

6. A radio frequency (RF) switching circuit for a communications device, the RF switching device comprising:
   a triangle-shaped substrate; and
   RF switching circuitry carried by said triangle-shaped substrate and to be coupled between an RF transmitter in the communications device and a transmission line in the communications device;
   said triangle-shaped substrate having a proximal end to be coupled to the transmission line, and a distal end extending outwardly from the transmission line;
   said RF switching circuitry comprising a series diode, and a shunt diode coupled to said series diode, said series diode extending from the tapered proximal end and across an interior of said triangle-shaped substrate.

7. The RF switching circuit of claim 6 wherein the distal end of said triangle-shaped substrate is to be coupled to an antenna of the communications device.

8. The RF switching circuit of claim 6 wherein said shunt diode comprises a PIN shunt diode; and wherein said series diode comprises a PIN series diode.

9. A method of making a radio frequency (RF) communications device, the method comprising:
   forming a circuit board comprising at least one dielectric layer and a plurality of conductive traces thereon, one of the plurality of conductive traces defining a transmission line;
   forming an RF transmitter on the circuit board and coupled to the transmission line; and
   forming a plurality of triangle-shaped RF switching circuits, each triangle-shaped RF switching circuit comprising a substrate having a tapered proximal end coupled to the transmission line, and a distal end extending outwardly from the transmission line, each triangle-shaped RF switching circuit comprising a series diode, and a shunt diode coupled to the series diode, the series diode extending from the tapered proximal end and across an interior of the substrate.

10. The method of claim 9 further comprising coupling an antenna to the distal ends of the plurality of triangle-shaped RF switching circuits.

11. The method of claim 9 wherein each triangle-shaped RF switching circuit is discretely packaged.

12. The method of claim 9 wherein the shunt diode comprises a PIN shunt diode; and wherein the series diode comprises a PIN series diode.

13. The method of claim 9 further comprising coupling the plurality of triangle-shaped RF switching circuits to the transmission line in order of increasing operational frequency.

* * * * *